(12) United States Patent
Yokoi et al.

(10) Patent No.: US 11,018,484 B2
(45) Date of Patent: May 25, 2021

(54) SERPENTINE COMB ASSEMBLY FOR CABLE MANAGEMENT AND RETENTION VIA CURVE ENGAGEMENT

(71) Applicant: ORACLE INTERNATIONAL CORPORATION, Redwood City, CA (US)

(72) Inventors: Glenn Anderson Yokoi, Hillsboro, OR (US); Geoffrey B. Ford, Beaverton, OR (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 95 days.

(21) Appl. No.: 16/446,719

(22) Filed: Jun. 20, 2019

(65) Prior Publication Data
US 2020/0403388 A1    Dec. 24, 2020

(51) Int. Cl.
*H02G 3/04*    (2006.01)
*H02G 3/30*    (2006.01)
*H05K 7/14*    (2006.01)

(52) U.S. Cl.
CPC ......... *H02G 3/0406* (2013.01); *H02G 3/0456* (2013.01); *H02G 3/30* (2013.01); *H05K 7/1491* (2013.01)

(58) Field of Classification Search
CPC .... H02G 3/0406; H02G 3/0437; H02G 3/045; H02G 3/0456; H02G 3/0633; H02G 3/28; H02G 3/30; H02G 3/34; H05K 7/1491
See application file for complete search history.

(56) References Cited

U.S. PATENT DOCUMENTS

| 4,781,255 A * | 11/1988 | Lock .................... H02G 3/0418 138/115 |
| 5,115,260 A * | 5/1992 | Hayward ............. G02B 6/4471 174/255 |
| 5,399,812 A * | 3/1995 | Woszczyna ......... B60R 16/0215 138/115 |
| 6,268,566 B1 * | 7/2001 | Takiguchi ........... B60R 16/0215 174/72 A |
| 7,119,280 B1 * | 10/2006 | Ray ...................... H02G 3/0437 174/72 A |

* cited by examiner

*Primary Examiner* — Timothy J Thompson
*Assistant Examiner* — Amol H Patel
(74) *Attorney, Agent, or Firm* — Snell & Wilmer L.L.P.; Kent A. Lembke

(57) ABSTRACT

A cable manager or serpentine comb assembly that can be provided as part of or as an add-on accessory to an electronics cabinet or enclosure (such as in a server rack or the like) to provide improved cable management. The cable manager uses a series of spaced-apart curved features or walls ("comb teeth") to retain cables axially and laterally. The movement restriction provided by the cable manager is a product of the mechanical interaction of a cable, positioned in a channel or void between an adjacent pair of these curved walls/comb teeth, with the curved surfaces on the cable manager. The channels can be sized with varying widths and engagement curvatures to account for flexibility and minimum bend requirements of the cables being retained and managed by the cable manager or based on its intended use.

18 Claims, 6 Drawing Sheets

SERPENTINE COMB ASSEMBLY FOR CABLE MANAGEMENT AND RETENTION VIA CURVE ENGAGEMENT

BACKGROUND

1. Field of the Invention

The present description generally relates to cable management for enclosures, such as cabinets, racks, and/or any container or vessel, used for mounting and enclosing servers and other computer equipment, telecommunications equipment, and electronics. More particularly, the present description relates to an assembly or apparatus configured for use on such enclosures to provide improved cable management and retention through the use of curve engagement in place of conventional bundling and/or constrictive methods.

2. Relevant Background

There are numerous settings or environments where electronic equipment, computers and computer equipment (e.g., servers, routers, and so on), and telecommunications equipment are provided in a centralized location in standard or conventional enclosures such as racks and cabinets. Often, this equipment is provided within a box or chassis that is then mounted within the enclosure. Such use of enclosures with configurable electronic or computer devices can be found in data centers, computer rooms, network rooms, control rooms, telecommunication centers, and so on. Typically, the enclosures will have one or more holes or openings in an exposed sidewall, and numerous power and communication cables (e.g., tens to hundreds of cables) extend out from the equipment and down a side of the enclosures.

Due to the large number of cables used in such enclosures, management of these cables has become an important and challenging aspect for designers and operators of facilities containing these enclosures. Traditional system-level cable management and retention uses constrictive methods to group (such as by piece of equipment), align, and retain (or minimize space needed for) the many cables during manufacturing, transport, and in-service use. For example, cables may be grouped together or aligned on an enclosure using clips, zip ties, Velcro, and other cable bundling approaches. The bundled cables, or the bundling devices used to group the cables, are then often mounted to the enclosure, such as chassis or server rack, at one or more tie down point along the height of the enclosure through fixed loops or other enclosure-mounted features.

There remains a need for new devices or techniques for improving cable management. The spaces available for running cables is often very limited, which results in cables being forced through tight spaces and in dense packing of cables. Cables have a tendency to want to be straight (hang straight under gravity) or to be in their "natural state," and this can make it more challenging to use zip ties and other existing physical retention methods to manage and align cables in an organized fashion. Also, when a piece of equipment is changed out of an enclosure or cables need to be added, removed, or replaced, existing cable management often requires that an entire cable bundle (e.g., group of cables tied together via a Velcro band or the like) has to be undone or unbundled and then retied/bundled, which is challenging in tight spaces and with relatively stiff and heavy cables that resist bending away from their straight or natural state. Further, manufacturing build processes require significant wrap and rewrap activities, and there is a demand for cable management processes that can eliminate or reduce these frustrations and worker-intensive procedures.

SUMMARY

Briefly, the inventors created a standalone cable manager (or serpentine comb assembly) that can be provided as part of or as an add-on accessory to an electronics cabinet or enclosure (such as in a server rack or the like) to provide improved cable management. The cable manager uses a series of spaced-apart curved features or walls ("comb teeth") to retain cables axially and laterally. The movement restriction provided by the cable manager is a product of the mechanical interaction of a cable, positioned in a channel or void between an adjacent pair of these curved walls/comb teeth, with the curved surfaces on the cable manager. The channels can be sized with varying widths and engagement curvatures to account for flexibility and minimum bend requirements of the cables being retained and managed by the cable manager or based on its intended use.

The serpentine comb assembly provides at least two key functions. First, it provides an ability to bind and support the weight of the cables of varying outer diameters (ODs) without the need for traditional securing accessories (e.g., wax strings, hook and loop straps, cable ties, specialized tapes, and the like). Second, the new cable manager provides the ability to simultaneously dress cables as they are "layed" or inserted into each slot or channel of the cable manager.

More particularly, an apparatus is provided for retaining and managing cables on an enclosure. The apparatus (e.g., a cable manager) includes a base (e.g., a planar sheet of any useful material such as a rigid plastic, metal, ceramic, or the like), and the apparatus also includes a plurality of retaining walls extending a first distance from a side of the base. The retaining walls are spaced apart a second distance, and a slot or channel is defined by facing sides of adjacent pairs of the retaining walls. In some implementations of the apparatus the first distance defines a depth of each of the channels and the second distance defines a width of each of the channels. Each of the channels defines a serpentine path, whereby a cable received in and extending along a length of one of the channels is retained by friction generated between an outer surface of the cable and portions of the facing sides.

In some non-limiting embodiments, the adjacent pairs of the retaining walls are parallel, and the facing sides of the adjacent pairs define at least two curves, whereby curved surfaces are defined on the retaining walls for receiving and imparting a bend into one or more cables. In these or other embodiments, the curved surfaces are defined by an angle in the range of 10 to 45 degrees, while it may be desirable for the curved surfaces to be configured to have a bend radius greater than a minimum bend radius of the cable received in the one of the channels that is useful to ensure induced friction is large enough to support the weight of the received cable (which is bent out of its "natural state").

In some useful implementations, the depth of each channel is greater than 60 percent of an OD of the cable received in the one of the channels, and the width is greater the OD of the cable received in the one of the channels. In some case, the facing sides of the adjacent pairs define at least three curves, whereby at least three curved surfaces are defined on the retaining walls for abutting and imparting a bend into one or more cables inserted into one or more of the channels. The width of the channel may be varied among a first and a second set of the channels and/or curved surfaces on the facing sides defining the serpentine path may be configured to have differing bend radii for the first and second set of channels. Often, the base is planar, the retaining walls extends orthogonally (i.e., 85 to 95 degrees, 88 to 92 degrees, or even 90 degrees plus or minus 0.5 degrees) from the planar base, and the channel is open at an end opposite the planar base for receiving the cable.

DETAILED DESCRIPTION

Figure 1:
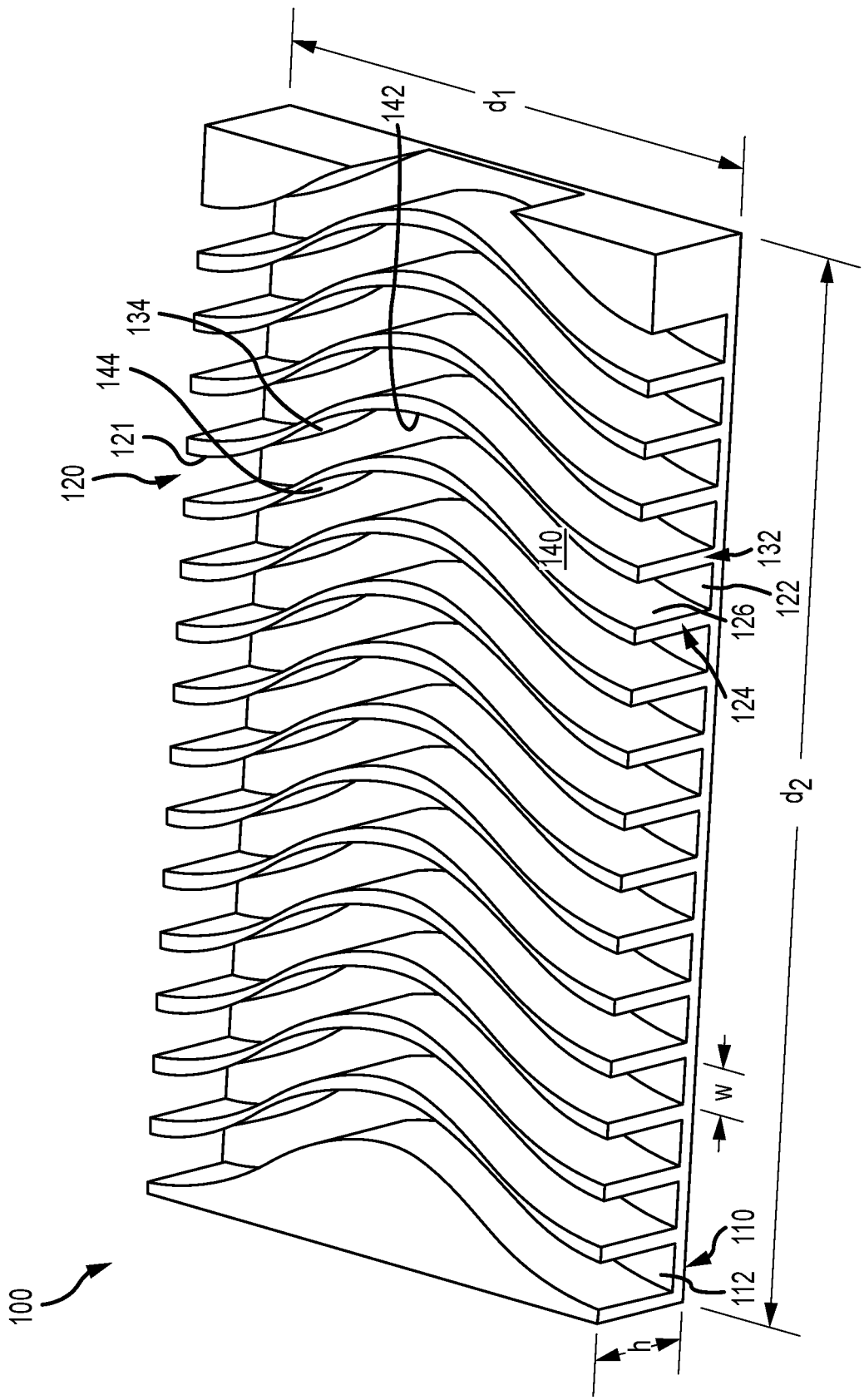
FIG. 1 illustrates a top perspective view of one embodiment of a cable manager or serpentine comb assembly of the present description.

The serpentine comb assembly or cable manager is designed to be provided upon an enclosure for electronic devices (such as a server rack, container, vessel, or the like) or as an add-on component. The cable manager uses a series of curved walls or comb teeth, which may have a serpentine cross sectional shape or profile, to provide curves or curved surfaces that act as cable retention devices. The inventors recognized that the natural state of a cable (e.g., a power cable, a communications cable, or the like) resists bending due to material stiffness, and, as a result, the cable will push back against any mechanical feature that forces it to bend beyond that level or out of its natural state. With this in mind, the cable manager is configured to force the cable, which is received in a channel or void space between an adjacent pair of the curved retention walls or comb teeth, against curved dressing surfaces. The resistance of the cable to bending results in a higher friction force against the curved surfaces of the retention wall of the cable manager. This higher friction force provides a mechanical retention of the cable both in the lateral direction and in the axial direction (e.g., vertical direction in many implementations) without additional retention features being needed, such as zip ties, to retain the cable within the cable manager.

The new cable manager or serpentine comb assembly allows faster installation of cables during initial assembly of an enclosure with electronic devices (such as servers or other computing devices) as the cables only need to be placed in the channel or retention path defined by two adjacent curved walls or comb teeth. The cable manager also allows a technician easier access to specific cables, rather than having to unbundle an entire grouping, since the technician only needs to remove cables in a given channel or retention path rather than trace through a large twisted or woven bundle and then unbundle the entire trunk to replace a particular cable. The inventors designed the cable manager using experimentally determined spacing between adjacent wall/teeth (e.g., channel widths) and curve engagement to provide enough friction force to retain a cable in a specific position.

As an example, one implementation of the cable manager uses a plastic comb structure that has a series of parallel serpentine-shaped channels. The plastic comb structure is attached to a server or network rack (or other enclosure, container, or vessel), and cables are routed through the serpentine-shaped channels when the cables are installed into network components. When the channels and its curves are sized properly, the cables are retained against a vertical wall (e.g., base of each channel provided by a planar retention wall support or platform of the cable manager) in a self-supporting and self-retaining manner. The cable manager is well-suited for use in many computer and telecommunication applications in which racks, cabinets, and other enclosures are utilized for components with a data center environment being one non-limiting but useful example. However, it is also likely the cable manager will find uses in any industrial or commercial application that uses a significant amount of cabling that needs dressing and retention as well as service access.

FIG. 1 illustrates a top perspective view of one embodiment of a cable manager or serpentine comb assembly 100 that may be affixed to an enclosure to manage and retain cables. The cable manager 100 is shown prior to attachment to an enclosure and prior to insertion of any cables. As shown, the cable manager 100 includes a base or platform 110 that often will be planar in its cross section for use with conventional rectangular enclosures but may be arcuate or have another nonplanar shape in some applications, e.g., to fit an enclosure's curved exterior or back surface.

Upon an upper (or inner) side 112 of the base 110, a plurality of parallel retention walls or comb teeth are provided as shown with adjacent retention walls/comb teeth 124 and 132 (an adjacent pair of the walls). In this embodiment, the walls 124, 132 are generally identical in configuration and with similar spacing between adjacent pairs. Particularly, the height, h, of the retention walls 124, 132 is uniform in the manager 100, but it may be varied in other implementations. The height, h, defines the depth of each channel or cable path 120 between adjacent retention walls 124, 132, and it typically has a minimum that is some value less than an outer diameter (OD) of a cable to be used in the cable manager 100 to allow a cable to be retained in the manager such as one half to two thirds of a maximum cable OD (with preferred embodiments typically using a channel depth that is 60 percent of the OD and more preferred using 90 percent of OD or greater depths) with other embodiments using a channel depth that is greater than about the largest expected cable OD. Other embodiments may use a height, h, that is two, three, or more times the OD so that two or more cables can be stacked within a channel 120. Some stacked applications may allow more than one cable per layer in a channel 120.

Further, the spacing, w, between adjacent pairs of the walls (such as between walls 124, 132) is uniform in the manager 100, but it may be varied in other implementations (as shown in later figures). The spacing, w, defines the width of the channel or cable path 120, and it is typically chosen to be some amount greater than the OD of the largest cable expected to be used in the cable manager, e.g., 110 to 125 percent of the largest cable OD, so that the cables can be positioned fully into each channel 120 for retention by the cable manager 100.

The dimension, $d_1$, of the cable manager 100 generally defines a linear length of the serpentine-shaped channel 120 (from an inlet 121 at an upper edge of the base 110 to an outlet 122 of the channel 120 at a lower edge of the base 110). The dimension, $d_1$, may vary to practice the manager 100, but it is generally selected to be large enough to have a minimum number of retaining curves in each serpentine channel 120 (such as at least two with three or more often preferred for more secure cable retention) with a particular radius (which is set to suit desired amounts of bend for a particular cable). The dimension, $d_2$, of the cable manager 100 is chosen to suit a particular enclosure such as to be less than its outer width, and the dimension, $d_2$ (or width of the cable manager 100), defines a maximum number of channels 120 that can be provided upon a particular cable manager 100, with it generally being preferred to provide the most channels that will fit in the space on the base provided by the dimension, $d_2$ (which depends on the wall spacing, w, and the thicknesses of walls 124, 132 which may also be varied to suit the material and desired structural strength such as from 0.1 to 0.25 inches thick).

Significantly, as shown in FIG. 1, each of the retention walls 124, 132 is serpentine in its shape and not simply linear. In other words, each longitudinal axis of a retention wall 124, 132 follows a path that follows a repeating pattern of convex and concave curves of predefined and, in some cases, matching radii. In the cable manager 100, each retention wall 124, 132 includes three such curved sections. This results in the facing sides 126 and 134 of walls 124, 132, which together define channel 120, providing a set (or series) of curved surfaces 140, 142, and 144 (or an inlet curve, a middle curve, and an outlet curve, and, in some useful but non-limiting examples with the inlet and outlet curve or every other curve when more than three curved surfaces being generally in a straight line or generally coplanar) that abut a received cable (not shown) to cause the cable to bend into a shape matching or approaching that of channel 120.

The received cable, hence, also has a number of curves (e.g., three in this example), and the serpentine path defined by channel 120 causes the cable to abut the inner sides 126, 134 of walls 124 and 132 that induces friction on the outer surface of the cable. The induced friction between the cable and curved surfaces 140, 142, 144 is large enough in magnitude to physically restrain the cable laterally (side-to-side between walls 124, 132) and also axially (e.g., cable hanging vertically in channel 120 of manager 100 will not fall out under gravity and is actually difficult (to impossible) to pull along its length out of the manager 100). The manager 100 may be made of nearly any rigid material such as a hard plastic, a metal (such as aluminum), or a composite material, and it may be useful to select a material that provides (or to treat sides 126, 134 to create) a surface coefficient of friction greater than some predefined amount with a rougher surface being preferred in some implementations to better retain the received cables.

Figure 2:
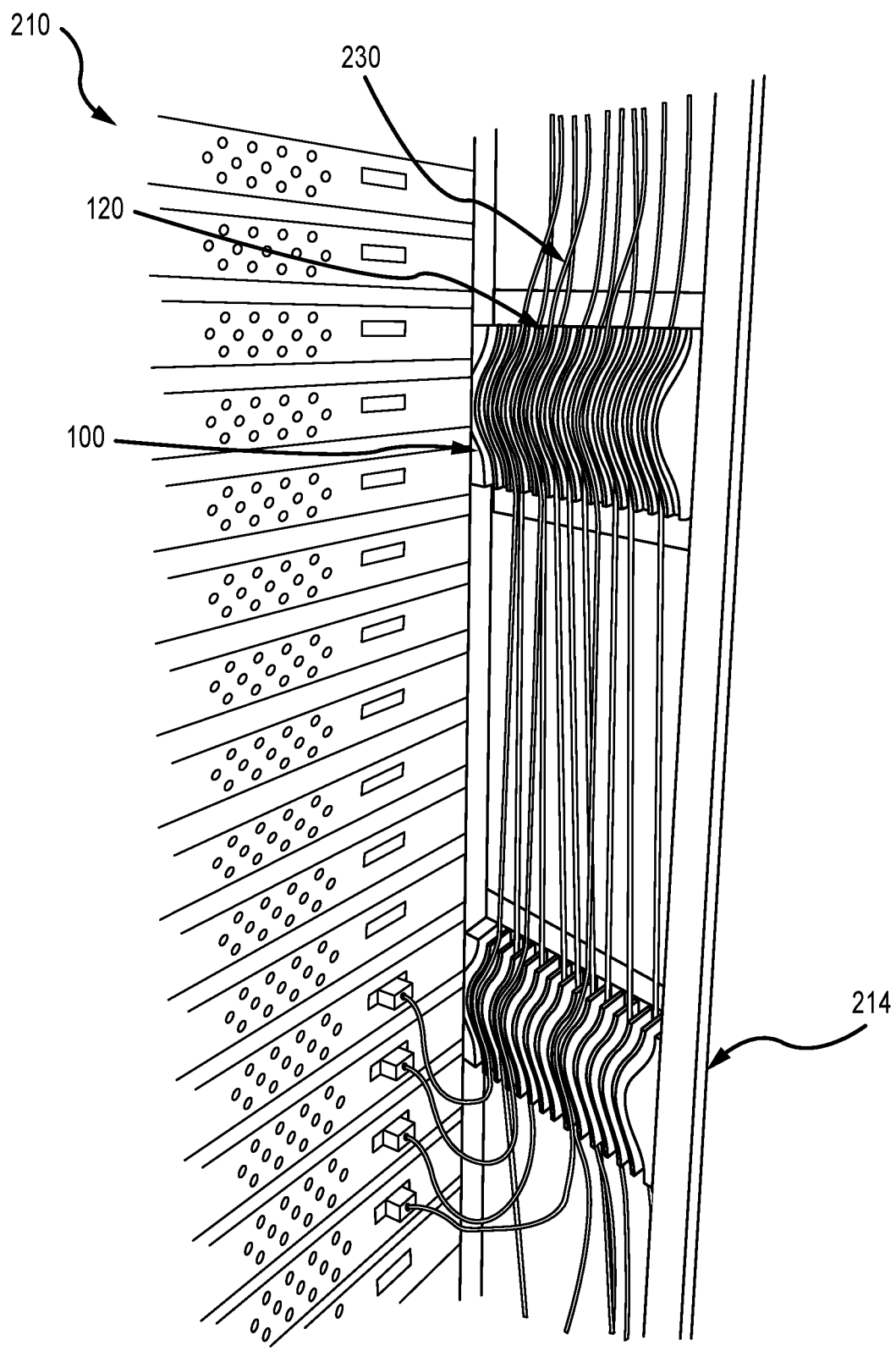
FIG. 2 illustrates an enclosure including the cable manager of FIG. 1 to retain cables.

FIG. 2 illustrates an exemplary enclosure 210 in the form of a server rack that includes the cable manager 100 of FIG. 1 during its use to retain and manage cables. As shown, the cable manager 100 is mounted onto a frame or exterior wall 214 of the enclosure (e.g., near the rear of the equipment held in the enclosure 210 as a snap on/in feature in some cases), with its channels including channel 120 oriented to extend vertically along the height of the enclosure. A cable 230 has been inserted or placed in the channel 120 by pressing it downward into the channel's depth (as discussed above the cable 230 would be difficult to impossible to pull through the channel 120). The cable 230, as a result, is bent to fit the retaining curved surfaces on the cable manager's walls (124 and 132 shown in FIG. 1), and the cable 230 attempts to return to its natural or straight state at these three curves (in this example) that produces friction on the cables outer surfaces. Restraints are not required for static application as shown. This means no bundling or debundling during manufacturing or service assembly. The inventors have tested the shown prototype cable manager 100 and proven that the cable 230 is physically retained without any further constrictive-type devices.

As noted above, there are a number of design parameters that can be varied to implement the cable manager or serpentine comb assembly concept taught herein. For example, the channels can vary in depth and width to allow two or more cables to be inserted into a channel, and the depth and/or width can be varied on the same cable manager. In one case, such a cable manager can be configured to provide some channels to hold 1-3 cables and others to hold 1 cable and others to hold 4 to 6 cables and the like on the same base by varying the retaining wall heights and/or spacing between adjacent pairs of such retaining walls, and this allows for segregation by priority or function. Curve angles of engagement (or radii of curved sections) can also be varied to induce more or less friction, and the channel and/or curve radii can also be selected for use with particular cables to ensure that cables are not bent too much to avoid inducing damage in the bent and retained cables.

Figure 3:
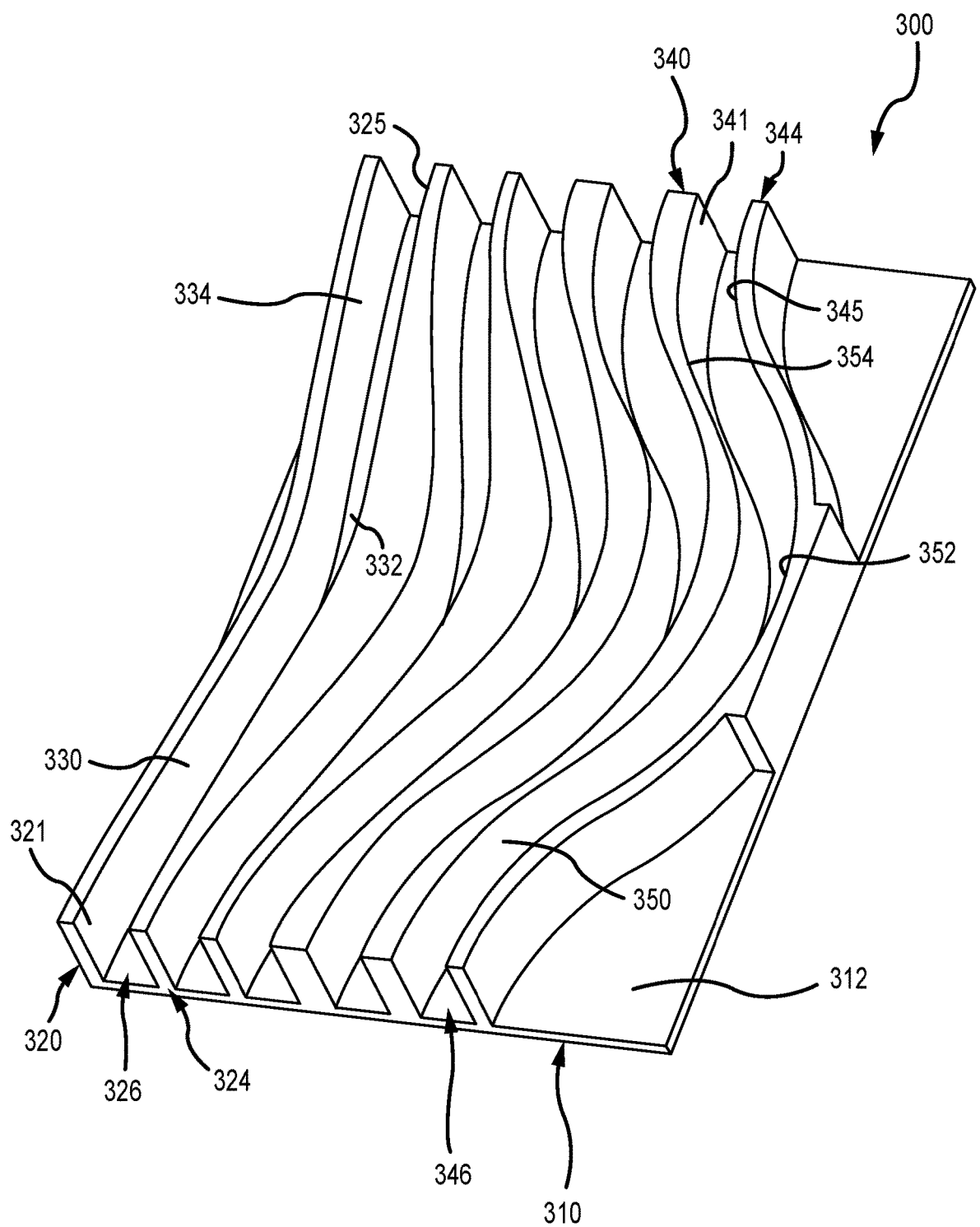
FIG. 3 illustrates a top perspective view of a second embodiment of a cable manager or serpentine comb assembly of the present description.

FIG. 3 illustrates another embodiment of a cable manager 300 in which channels with differing (e.g., greater) angles of engagement in the curved sections of the channels are provided to facilitate use with two differing types of cable (e.g., a larger OD and/or stiffer cable that has a smaller maximum bend and a smaller OD and/or more flexible cable with a larger maximum bend). As shown, a first channel 326 is provided on the cable manager 300 with greater angle of engagement in its three curved surfaces or sections 330, 332, 334, such as in the range of 5 to 20 degrees with 10 degrees shown (with this angle measured between a line extending linearly across the base or along a channel and the side of the wall defining the curved surface). The first channel 326 is provided by spaced apart and adjacent retaining walls 320 and 324, which extend up from side/surface 312 of planar base or platform 310, with their facing sides 321 and 325. The manager 300 includes two of these channels. Further, as shown, a second channel 346 is provided with smaller angle of engagement in its three curved surfaces or sections 350, 352, 354, such as in the range of 20 to 60 degrees with 45 degrees shown in FIG. 3. The second channel 346 is provided by spaced apart and adjacent retaining walls 340 and 344, which extend up from side/surface 312 of the base 310, with their facing sides 341, 345. The manager 300 includes three of these channels.

Figure 4:
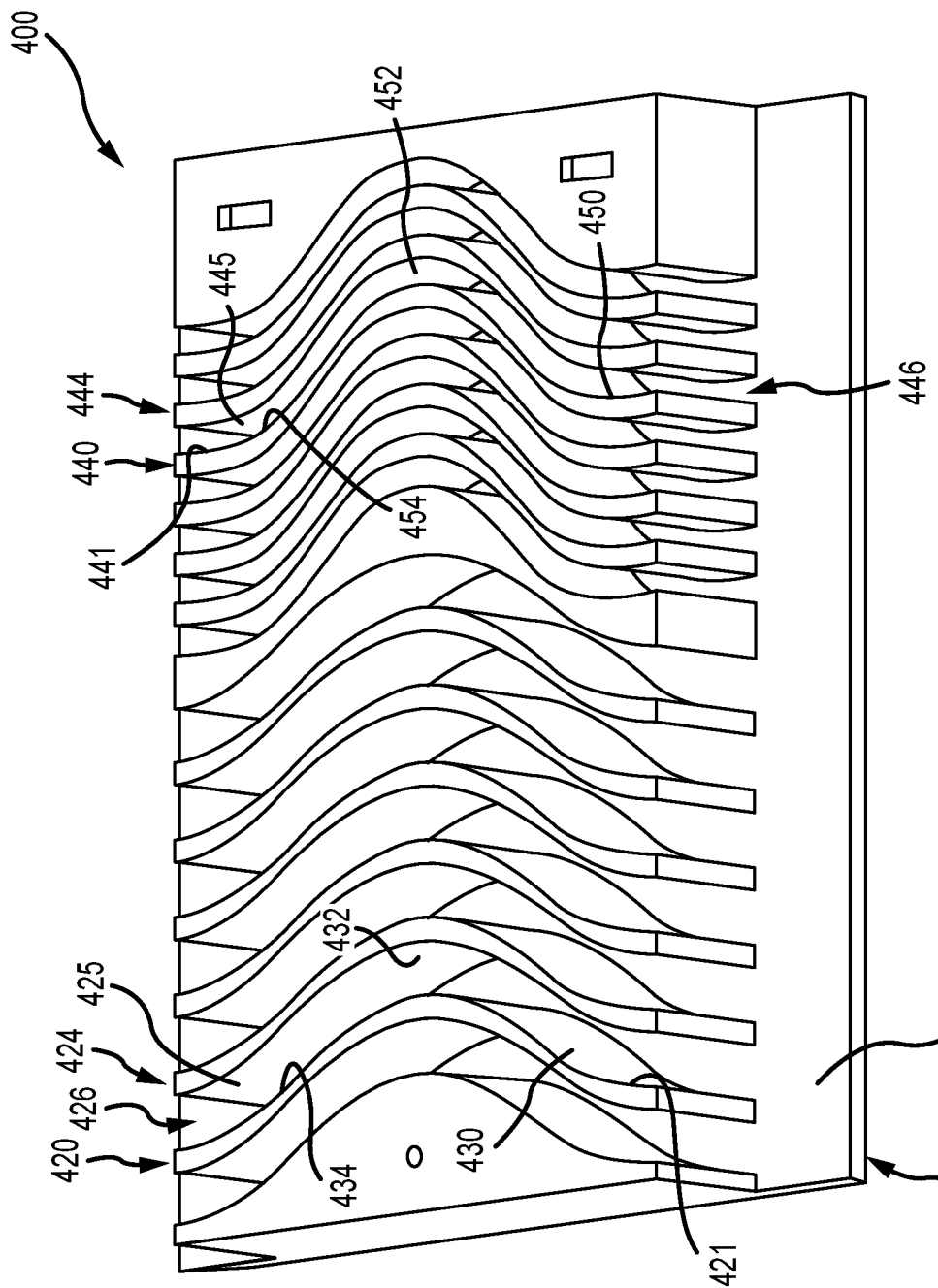
FIG. 4 illustrates a top perspective view of a third embodiment of a cable manager or serpentine comb assembly of the present description.

FIG. 4 illustrates another embodiment of a cable manager 400 in which channels with differing radii in the curved sections of the channels are provided to facilitate use with two differing types of cable (e.g., a larger OD and/or stiffer cable that has a smaller maximum bend and a smaller OD and/or more flexible cable with a larger maximum bend). As shown, a first channel 426 is provided on the cable manager 400 with larger radii in its three curved surfaces or sections 430, 432, 434, such as in the range of 20 to 45 degrees with about 45 degrees shown. The first channel 426 is provided by spaced apart and adjacent retaining walls 420 and 424, which extend up from side/surface 412 of planar base or platform 410, with their facing sides 421 and 425. In some cases, these larger channels may be used for larger OD cables such as Cat 6 Ethernet or the like. Further, as shown, a second channel 446 is provided with smaller radii in its three curved surfaces or sections 450, 452, 454, such as in the range of 40 to 75 degrees with 60 degrees shown in FIG. 4. The second channel 446 is provided by spaced apart and adjacent retaining walls 440 and 444, which extend up from side/surface 412 of the base 410, with their facing sides 441, 445. In some cases, smaller OD and/or more flexible cable such as fiber optic cable or the like, may be retained in these channels, which also have a smaller width than the channel 426.

Figure 5:
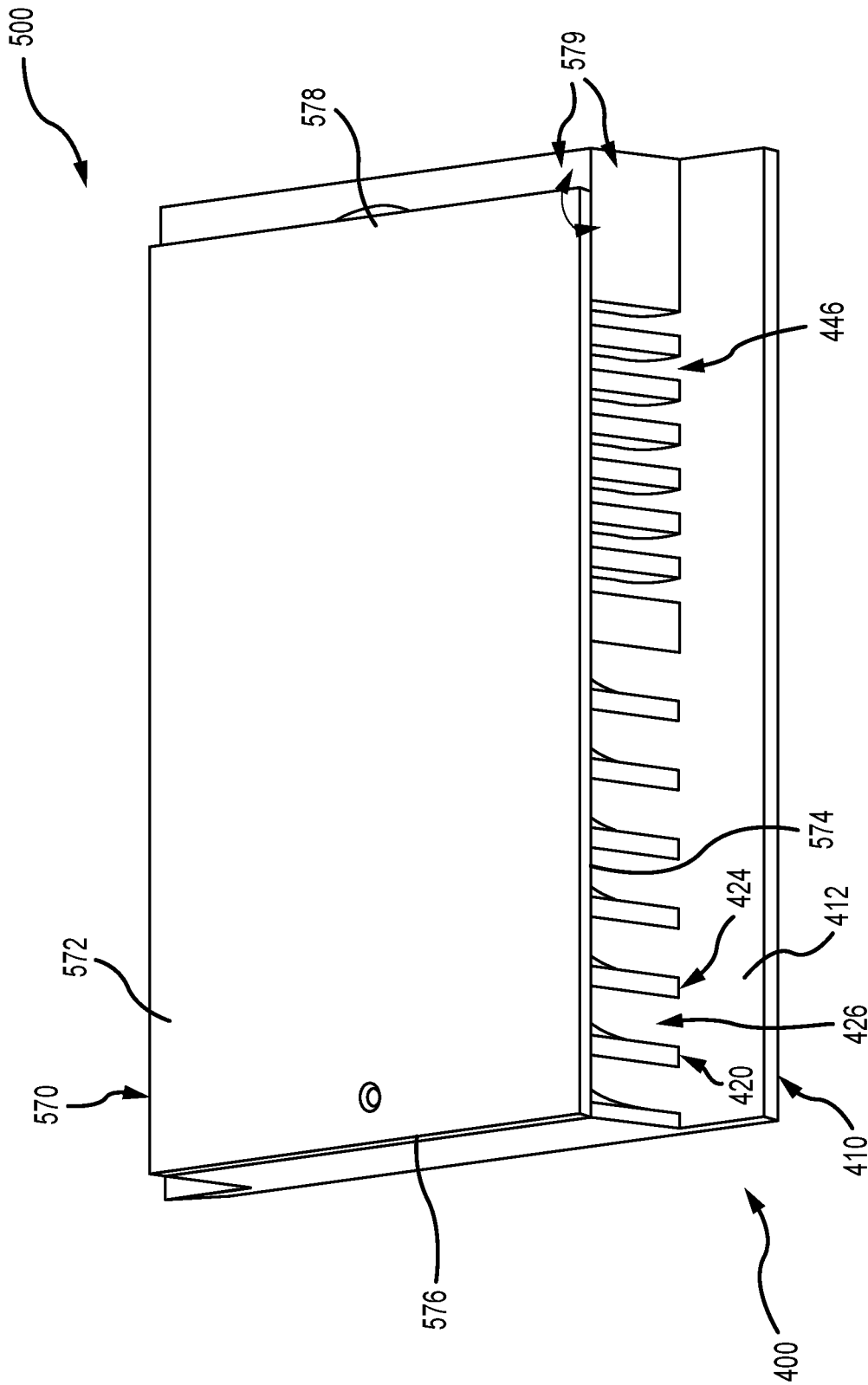
FIG. 5 illustrates a cable manager similar to that provided in FIG. 4 but with a removable restraint cover.

In dynamic applications in which the cable manager may be tipped from the vertical orientation shown in FIGS. 2-4, it may be desirable to provide additional features in the cable manager to restrain cables from peeling out of the channels. FIG. 5 illustrates another embodiment of a cable manager 500 that is adapted for dynamic applications. As shown, components of manager/comb assembly 400 are included in the manager 500 along with a removable retaining cover 570. The cover 570 is shown to be a planar plate with an outer surface/side 572 and an inner surface/side 574 that is positioned to cover and face the open channels including channels 426 and 446. The cover 570 extends from a first end 576 to a second end 578 (e.g., has a length large enough to extend over all open channels while the width may be the same or less than the length of the channels), and the cover 570 may be affixed in any desirable manner with press fit components, fasteners, or the like and/or with a pivot on one end such as on end 578 as shown with arrows 579.

Figure 6:
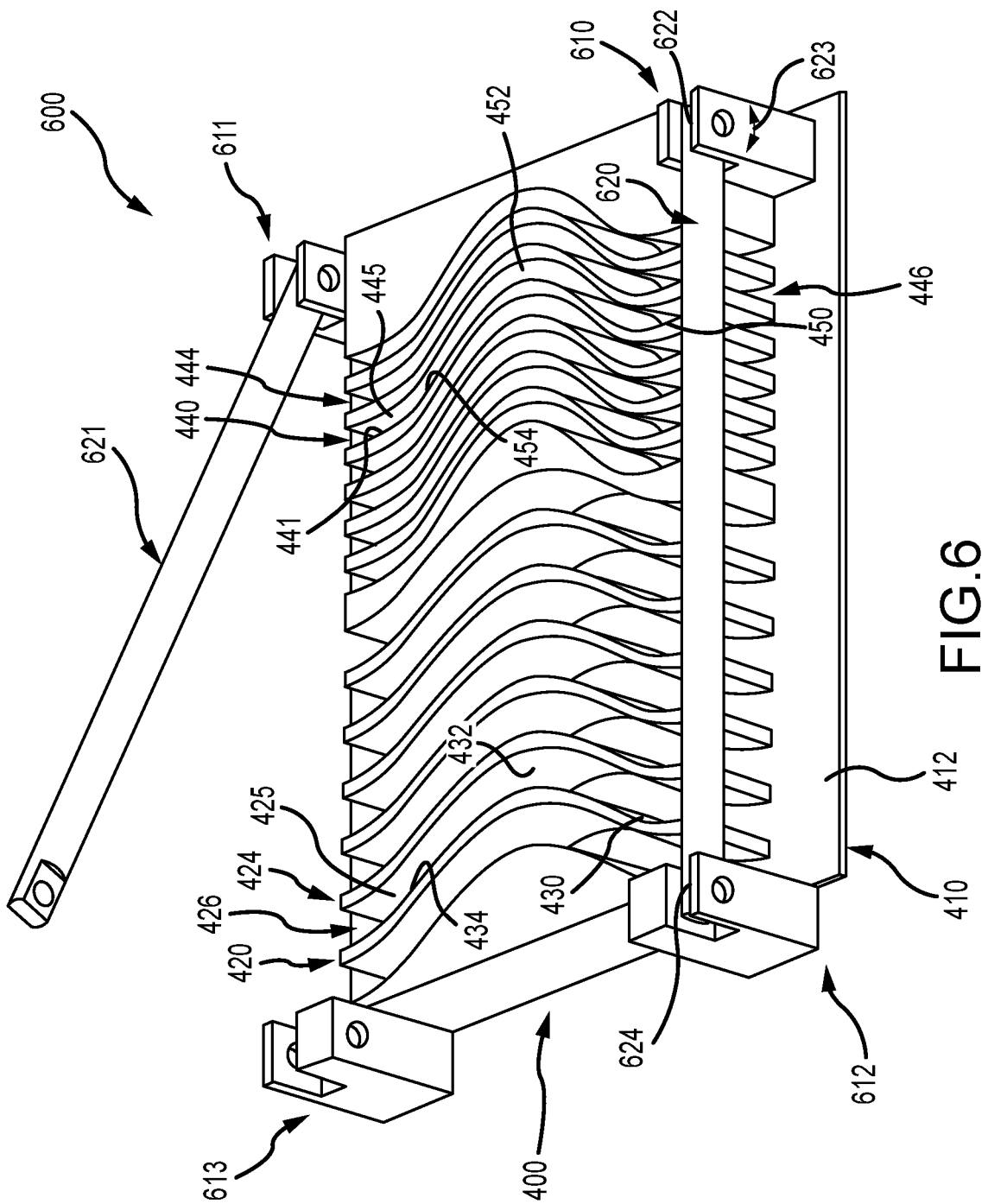
FIG. 6 illustrates a cable manager similar to that provided in FIG. 6 but with a pair of restraint bars in place of a restraint cover.

FIG. 6 illustrates another cable manager 600 useful in dynamic applications. In manager 600, the cover 570 shown in FIG. 5 is removed and replaced with items to provide a bar-type restraint to keep inserted cables from peeling out of open channels. The components of cable manager 400 are included in the cable manager 600, and a pair of (or left and right) restraint bars 620 and 621 are provided, and these bars may be affixed such as with pins at their ends in receiving posts 610, 612 and receiving posts 611, 613, respectively. One end may be pinned in, and the bar rotated (as shown with arrows 623) into a restraining position over the end of the open channel or just past the inlets and outlets as shown. As shown with bar 620, a first end 622 is pivotally coupled (although pivoting is not required) to a receiving post 610, which extends upward from base surface 412 (such as to position the bar end 622 at a height greater than the channel height in the manager 600). A second end 624 is coupled to the receiving post 612, which also extends upward from base surface 412 at a location past all the channel inlets (or outlets) and again to position the bar end 624 at a height greater than the channel height. Some embodiments may only use one restraint bar, but the use of two bars 620, 621 as shown at opposite ends of the channels 426, 446 is likely more useful in many applications to restrain cables received in the cable manager 600.

As will be understood, the bend radius of the curve can be selected to define a total length of engagement surface between the cable manager and the cable at each curved surface/section on a retaining wall. Some of the definitions above use angular definitions (i.e., angle between a line extending linearly across the base (see dimension d1 in FIG. 1) and a side of the retaining wall providing the curved surface/section). Smaller angles providing more gradual curves and larger radii so also provide larger total lengths of engagement surface while larger angles provide less gradual curves and smaller radii so less total length of engagement with each curved surface of a wall of the cable manager. The curves can also be stated as radius measurements such as with a 30-degree curve corresponding with a 40 mm radius, with a 40-degree curve corresponding with a 25 mm radius, and so on.

The curved surfaces can also be defined to ensure a minimum bend at the curved surfaces in the channel to retain a particular cable within a channel (when the channel is vertical on an enclosure). For example, the following values may be useful in designing the retaining walls and their curved surfaces (e.g., with curved surfaces providing radii at or greater than these values): (a) fiber at 30 mm minimum bend radii; (b) power cable at 35 mm minimum bend radii; (c) CAT5/6 at 37.5 mm minimum bend radii; and (d) QSFP/DAC/Twinax at 40 mm minimum bend radii. These values are selected based on the worst case for each cable type from all of our various suppliers.

Another unique feature or characteristic of the serpentine profile of the cable manager is its ability to contain cables of varying diameters. Each channel typically can receive and retain a range of cable sizes (or ODs) and stiffnesses. For example, if a width of a channel is 0.25 inches, cables of a smaller but varying OD (e.g., 0.125 inches, 0.0625 inches, and the like) can be dressed into the same slot and each will be independently restrained by friction induced by the curvature of the channel.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

We claim:

1. An apparatus for retaining and managing cables on an enclosure, comprising:
   a base; and
   a plurality of retaining walls extending a first distance from a side of the base,
   wherein the retaining walls are spaced apart a second distance,
   wherein a channel is defined by facing sides of adjacent pairs of the retaining walls,
   wherein the first distance defines a depth of each of the channels and the second distance defines a width of each of the channels,
   wherein each of the channels defines a serpentine path, whereby a cable received in one of the channels and extending along a length of the one of the channels is retained by friction generated between an outer surface of the cable and portions of the facing sides,
   wherein the facing sides of the adjacent pairs define at least two curves whereby curved surfaces are defined on the retaining walls for receiving and imparting a bend into one or more cables, and
   wherein the curved surfaces are configured to have a bend radius greater than a minimum bend radius of the cable received in the one of the channels.

2. The apparatus of claim 1, wherein the curved surfaces are defined by an angle in the range of 10 to 45 degrees.

3. The apparatus of claim 1, wherein the depth is greater than 60 percent of an outer diameter (OD) of the cable received in the one of the channels and wherein the width is greater than the OD of the cable received in the one of the channels.

4. The apparatus of claim 1, wherein the facing sides of the adjacent pairs define at least three curves whereby at least three curved surfaces are defined on the retaining walls for abutting and imparting a bend into one or more cables inserted into one or more of the channels.

5. The apparatus of claim 1, wherein the width varies among a first and a second set of the channels or wherein curved surfaces on the facing sides defining the serpentine path have differing bend radii for the first and second set of channels.

6. The apparatus of claim 1, wherein the base is planar, wherein the retaining walls extend orthogonally from the planar base, and wherein the channel is open at an end opposite the planar base for receiving the cable.

7. The apparatus of claim 1, wherein the minimum bend radius is in the range of 30 millimeters (mm) to 40 mm.

8. An apparatus for managing cables extending from equipment in an enclosure, comprising:
a base configured for attachment to the enclosure;
a first wall extending outward from a side of the base; and
a second wall extending outward from the side of the base,
wherein the first wall has a side facing the second wall and the second wall has a side facing the first wall,
wherein the side of the first wall facing the second wall includes at least two curved surfaces each with a bend radius greater than a minimum bend radius of each of the cables, and
wherein the side of the second wall facing the first wall is spaced apart a distance from the side of the first wall facing the second wall, whereby a channel, which is open on an end opposite the base, for receiving one or more of the cables is defined between the first and second wall.

9. The apparatus of claim 8, wherein the bend radius is greater than about 30 mm.

10. The apparatus of claim 8, wherein the distance is greater than 60 percent of a maximum outer diameter of any of the cables.

11. The apparatus of claim 8, wherein the channel includes an inlet and an outlet, whereby the cables can extend along a length of the channel and extend outward from the inlet and from the outlet on opposite ends of the channel.

12. The apparatus of claim 8, further comprising a restraint bar extending over the open channel and being pivotally mounted to allow the cables to be inserted into the channel and to restrain movement of the cables out of the channel in a direction opposite the base when positioned over the open channel.

13. A system adapted for cable retention and management, comprising:
an enclosure; and
a cable manager attached to an exposed surface of the enclosure,
wherein the cable manager comprises at least one open channel extending vertically along the enclosure from an inlet to an outlet along a serpentine path having two or more curves,
wherein a cable received in the open channel is bent in at least two locations to follow the serpentine path and is retained laterally and axially within the open channel by friction, induced by gravity, between outer surfaces of the cable and surfaces of the open channel defining the two or more curves,
wherein the cable manager comprises:
a base; and
a pair of retaining walls extending a first distance from a side of the base, wherein the retaining walls are spaced apart a second distance, wherein the at least one open channel is defined by facing sides of the retaining walls, wherein the first distance defines a depth of the at least one open channel and the second distance defines a width of the at least one open channels, and wherein the induced friction is generated between the outer surface of the cable and portions of the facing sides.

14. The system of claim 13, wherein the two or more curves are defined by an angle in the range of 10 to 45 degrees, the angle being measured between a vertical axis of the cable manager and each of the facing sides.

15. The system of claim 13, wherein the two or more curves are configured to have a bend radius greater than a minimum bend radius of the cable received in the channel.

16. The system of claim 13, wherein the depth is greater than 60 percent of an outer diameter (OD) of the cable received in the one of the channels and wherein the width is greater than the OD of the cable received in the one of the channels.

17. The system of claim 13, wherein the channel includes at least two curves whereby at least two curved surfaces are defined on the facing sides for abutting and imparting a bend into one or more cables inserted into the channel.

18. The system of claim 13, wherein the cable is retained in the open channel solely by the induced friction without use of additional securing accessories in the enclosure to bind or support the cable.

* * * * *